United States Patent

Hempel

[11] Patent Number: 5,597,443
[45] Date of Patent: Jan. 28, 1997

[54] METHOD AND SYSTEM FOR CHEMICAL MECHANICAL POLISHING OF SEMICONDUCTOR WAFER

[75] Inventor: Eugene O. Hempel, Garland, Tex.

[73] Assignee: Texas Instruments Incorporated, Dallas, Tex.

[21] Appl. No.: 298,808

[22] Filed: Aug. 31, 1994

[51] Int. Cl.⁶ .......................... B24B 37/00; H01L 21/00
[52] U.S. Cl. .............................. 156/636.1; 134/2; 134/33
[58] Field of Search .................... 156/636.1, 645.1; 134/2, 3, 33; 451/287, 289, 290

[56] References Cited

U.S. PATENT DOCUMENTS

| | | | |
|---|---|---|---|
| 4,116,714 | 9/1978 | Basi | 134/3 |
| 4,129,457 | 12/1978 | Basi | 134/2 |
| 4,184,908 | 1/1980 | Lackner et al. | 134/34 X |
| 4,671,846 | 6/1987 | Shimbo et al. | 134/3 X |
| 5,078,801 | 1/1992 | Malik | 134/7 X |
| 5,100,476 | 3/1992 | Mase et al. | 134/1 |
| 5,120,370 | 6/1992 | Mori et al. | 134/22.15 |
| 5,181,985 | 1/1993 | Lampert et al. | 156/635 |
| 5,294,570 | 3/1994 | Fleming, Jr. et al. | 134/3 X |
| 5,320,706 | 6/1994 | Blackwell | 156/636.1 |
| 5,329,732 | 7/1994 | Karlsrud et al. | 451/289 |
| 5,382,296 | 1/1995 | Anttila | 134/3 |
| 5,389,194 | 2/1995 | Rostoker et al. | 134/1.3 |

FOREIGN PATENT DOCUMENTS 3-131026  6/1991  Japan.

*Primary Examiner*—Thi Dang
*Attorney, Agent, or Firm*—W. James Brady, III; Richard L. Donaldson

[57] ABSTRACT

A method and system (10) for chemical mechanical polishing (CMP) semiconductor wafer (14) coats (22) semiconductor wafer (14) with a slurry having an predetermined pH value. Semiconductor wafer (14) is then polished with polishing pad (19). Then, CMP system (10) sprays semiconductor wafer (14) with an aqueous solution (30) and a pH controlling compound (34) for controlling the predetermined pH of the slurry and removing the slurry from the semiconductor wafer (14). The effect is minimize the number of particles remaining on semiconductor wafer (14) following the CMP process.

12 Claims, 3 Drawing Sheets

5,597,443

METHOD AND SYSTEM FOR CHEMICAL MECHANICAL POLISHING OF SEMICONDUCTOR WAFER

TECHNICAL FIELD OF THE INVENTION

The present invention relates to a method and system for processing an electronic device and, more particularly, to a method and system for chemical mechanical polishing semiconductor wafers that provide improved semiconductor wafer yield and increased polishing throughput.

BACKGROUND OF THE INVENTION

Advances in electronic devices generally include reducing the size of components that form integrated circuits. With smaller circuit components, the value of each unit area on a semiconductor wafer becomes higher, because the ability to use all of the wafer area for circuit components improves. To properly form an integrated circuit using advanced circuit designs that use much higher percentage of the wafer area for smaller components, it is critical that particle counts on the semiconductor wafer be reduced below levels which were previously acceptable for many circuit designs. For example, minute particles of less than 0.2 microns are unacceptable for many of the popular advanced circuit designs, because they can damage the integrated circuit by shorting out two or more lines. In order to clean a semiconductor wafer and remove unwanted particles, a process known as chemical mechanical polishing (CMP) has become popular.

CMP systems coat the semiconductor wafer with a slurry that serves to not only lubricate mechanical devices that contact and polish the semiconductor wafer, but also to provide a delicately abrasive compound that polishes the semiconductor wafer. After polishing the semiconductor wafer, the CMP system attempts to rinse the slurry from the wafer and then transfers the wafer to a buffing station. At the buffing station, an attempt is made to reduce the particle count further by buffing the semiconductor wafer circuit. Thereafter, the CMP system rinses the semiconductor wafer. Then, the CMP system releases the wafer for further processing.

Certain limitations relate to the process that known CMP systems use. One limitation is the time required to polish the semiconductor wafer. Any improved method that reduces the processing time would improve the overall throughput or the manufacture of electronic devices. Another limitation relates to the handling of the semiconductor wafer in the polishing process. Oftentimes, scratches occur on the semiconductor wafer surface due to the wafer handling. If there were a way to limit the amount of handling of the semiconductor wafer, much of this scratching could be avoided. A further and very important problem associated with current CMP systems is that the slurry that the process uses often forms particles on the semiconductor wafer. These particles, just like impurities from other parts of the fabrication process, can detrimentally affect operation of the resulting integrated circuit.

SUMMARY OF THE INVENTION

Therefore, a need has arisen for a method and system for chemical mechanical polishing a semiconductor wafer that provides improved semiconductor wafer yield and increased wafer throughput.

There is a need for an improved method and system for chemical mechanical polishing a semiconductor wafer that provides a reduced number of handling steps to decrease the amount of time necessary to perform the CMP process and, thereby, increase the semiconductor wafer throughput.

There is a further need for an improved CMP method and system that avoids unnecessary handling steps and, consequently, avoids scratches and defects that often occur on the semiconductor wafer surface from conventional CMP processes.

There is yet a further need for an improved method and system for chemical mechanical polishing a semiconductor wafer that more completely removes the slurry of the CMP process and, thereby, reduces the resulting particle count on the semiconductor wafer surface.

Accordingly, the present invention provides a method and system for chemical mechanical polishing a semiconductor wafer that improves semiconductor wafer yield and increases wafer throughput and that substantially eliminates or reduces disadvantages and problems associated with previously developed CMP methods and systems.

More specifically, one aspect of the present invention provides a method for chemical mechanical polishing a semiconductor wafer that includes the steps of coating a polishing pad with the slurry which has a predetermined or known pH value. The method further includes the steps of polishing the semiconductor wafer with a slurry-coated polishing pad. Then, the method includes the step of spraying the semiconductor wafer with a solution, preferably an aqueous solution, that includes a pH controlling compound for controlling the predetermined pH of the slurry and removing the slurry from the semiconductor wafer.

Another aspect of the invention provides a CMP system and related method for using the system to polish a semiconductor wafer. The CMP system permits carrying out the steps of removing the semiconductor wafer from a load cassette and placing the semiconductor wafer on a carrier device. A primary platen receives the semiconductor wafer and carrier device. The CMP system coats a pad on the primary platen with a slurry that includes a mixture of lubricating agents and delicately abrasive materials while the semiconductor wafer is on the primary platen. The CMP system then polishes the semiconductor wafer by rotating the polishing pad and carrier that holds the semiconductor wafer in opposite directions and placing the rotating semiconductor wafer in contact with the rotating pad which contains the lubricating and abrading slurry. After polishing the wafer, the CMP system moves the semiconductor wafer and carrier device to a cleansing station for removing the slurry from the semiconductor wafer. Removing the slurry from the semiconductor wafer occurs next using a pressurized aqueous solution that includes a pH controlling mixture for controlling the pH of the slurry coating. The aqueous solution has sufficient force to spray away from the semiconductor device the slurry coating, while the pH controlling mixture neutralizes the pH of the slurry to facilitate its removal. The CMP system then removes the semiconductor wafer and places the semiconductor wafer in an unload cassette without further handling or buffing of the semiconductor wafer.

A technical advantage of the present invention is that it places the semiconductor wafer in its unload cassette directly after spraying the wafer to remove the slurry coating. This, therefore, eliminates the buffing steps of conventional devices and the associated scratches that often occur during buffing, as well as the time required for the buffing.

A further technical advantage of the present invention is that it sprays solution that, in the present embodiment, includes an aqueous $NH_4OH$ mixture that controls the basic pH of the slurry. The present embodiment forms an aqueous solution by spraying water to the semiconductor wafer through a mist of a concentrated $NH_4OH$ mixture. The aqueous $NH_4OH$ mixture controls the pH of the slurry on the semiconductor wafer and, thereby, facilitates its removal. The effects of this step in conjunction with the CMP step are that often particle defect counts on the semiconductor wafer become fewer than 20 particles per wafer.

Yet another technical advantage of the present invention is that it may easily be used by a polishing system that simultaneously polishes numerous semiconductor wafers. In such a system, a polishing mechanism simultaneously polishes numerous semiconductor wafers each with a separate polishing pad. The spray mechanism of such a polishing system easily accommodates the spraying of numerous semiconductor wafers simultaneously. This even further increases the throughput of semiconductor wafers in the CMP process.

BRIEF DESCRIPTION OF THE DRAWINGS

For a more complete understanding and the advantages thereof, reference is now made to the following description which is to be taken in conjunction with the accompanying drawings in which like reference numerals indicate like features and wherein.

DETAILED DESCRIPTION OF ILLUSTRATIVE EMBODIMENTS

Illustrative embodiments of the present invention are illustrated in the FIGUREs wherein like numerals are used to refer to like and corresponding parts of the various drawings.

Figure 1:
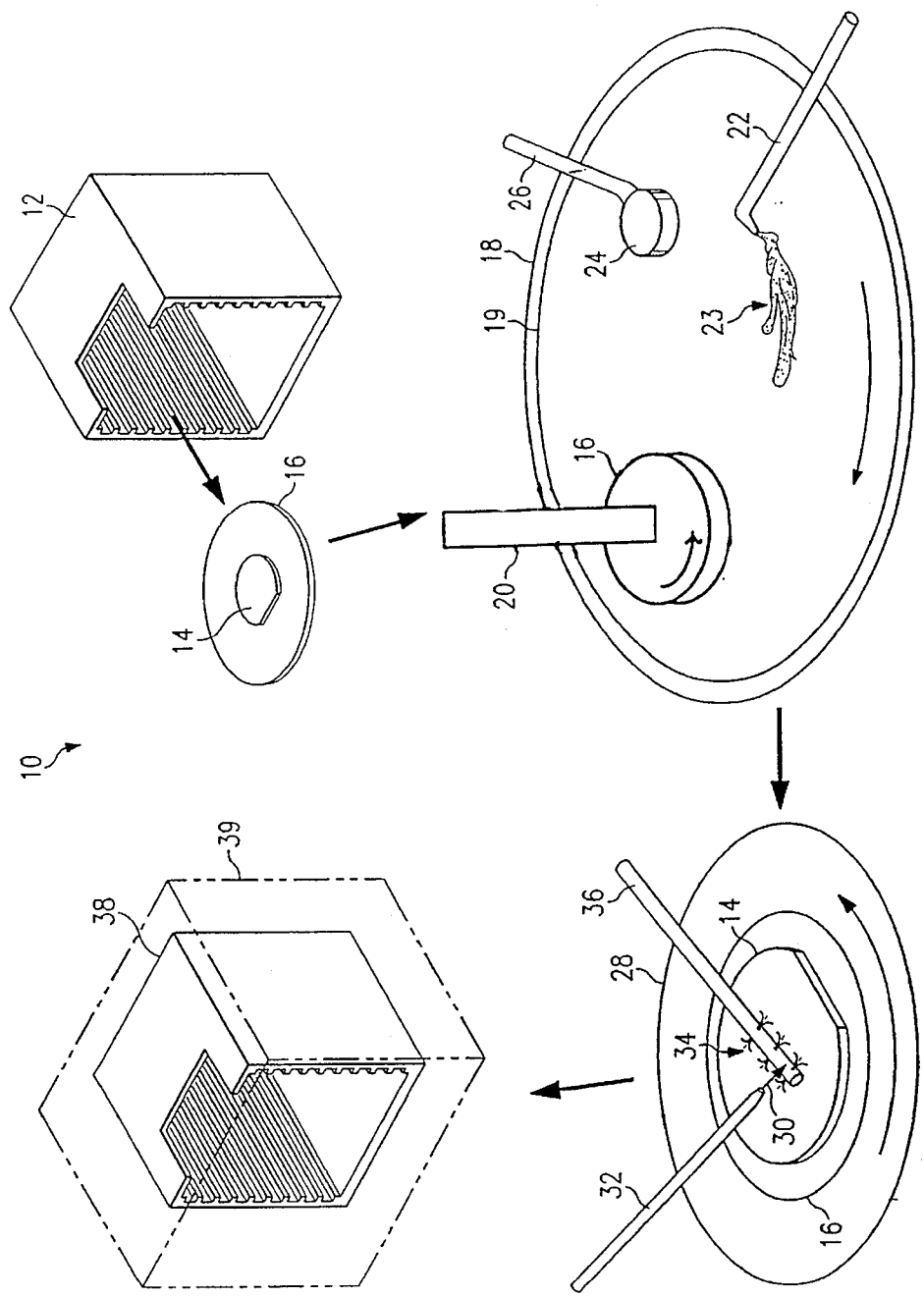
FIG. 1 provides a flow diagram of the chemical mechanical polishing method and system of the present embodiment.

FIG. 1 shows a process flow for the CMP system 10 of the present embodiment. In FIG. 1, load cassette 12 contains numerous semiconductor wafers, such as semiconductor wafer 14. CMP system 10 transfers semiconductor wafer 14 to wafer carrier 16 which by vacuum force holds wafer 14. Wafer carrier 16 attaches to robotic arm 20 which turns wafer carrier 16 upside down and transfers semiconductor wafer 14 and wafer carrier 16 to primary platen 18. Primary platen 18 includes pad 19 for polishing semiconductor wafer 14 and rotates, in this example, clockwise. During conditioning, wafer carrier 16 rotates so that semiconductor wafer 14 contacts pad 19 while rotating in a direction opposite to that of pad 19. This rotary force, together with the polishing surface of pad 19 and the lubricating and abrasive properties of slurry 23, polishes semiconductor wafer 14. Slurry dispensing mechanism 22 dispenses slurry 23 to coat pad 19. End effector 24 conditions pad 19 to receive slurry 23 by moving back and forth over pad 19 under the control of robotically controlled positioning arm 26.

After polishing, robotic arm 20 transfers wafer carrier 16 and semiconductor wafer 14 to cleansing station 28. At cleansing station 28, robotic arm 20 holds semiconductor wafer 14 and wafer carrier 16. A jet spray of water 30 emits from jets 32 to mix with $NH_4OH$ spray 34 that emits from $NH_4OH$ dispenser 36. The combination of high pressure water 30 and pH controlling spray 34 is highly effective to remove the residual slurry from semiconductor wafer 14. After spraying semiconductor wafer 14 with the aqueous solution of $NH_4OH$, CMP system 10 transfers the semiconductor wafer 14 to unload cassette 38 which is fully submersed in wafer. Once in unload cassette 38, further processing of semiconductor wafer 14 may occur.

Figure 2:
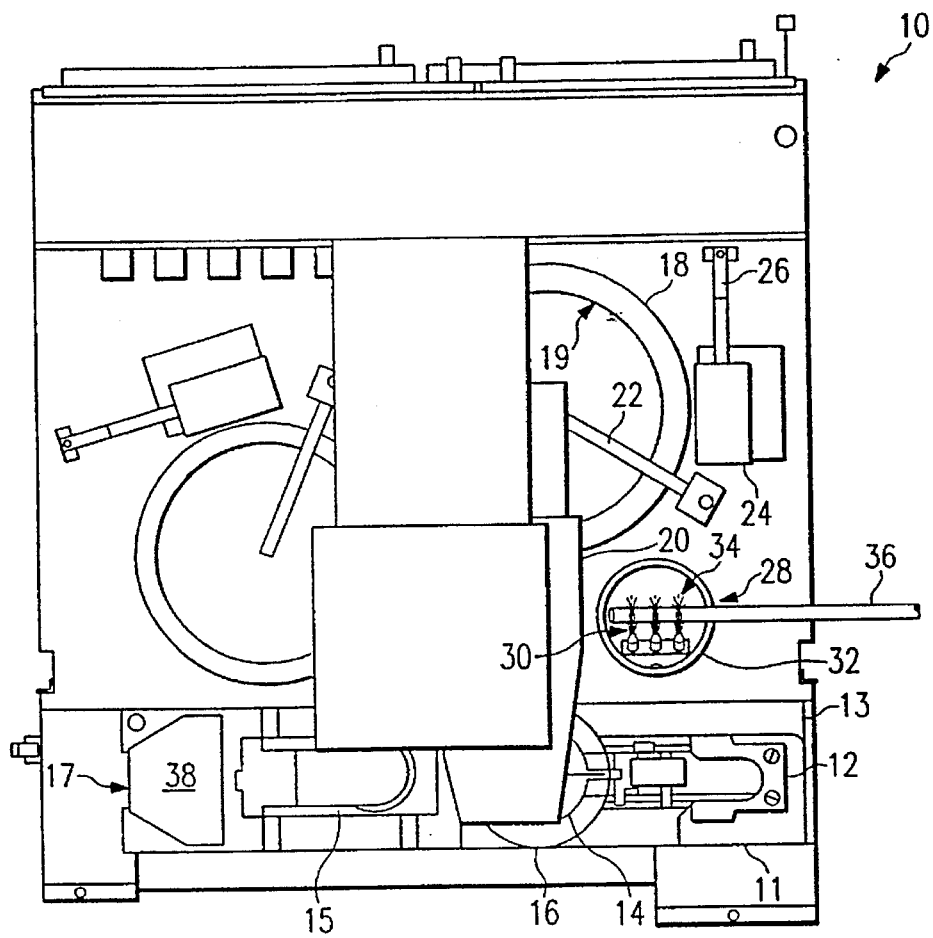
FIG. 2 provides a schematic view of one embodiment of the invention that includes an $NH_4OH$ dispenser associated with a cleaning station spray mechanism.

FIG. 2 shows a top view of an exemplary CMP system 10 for performing the process that FIG. 1 depicts. In CMP system 10, cassette load elevator 11 elevates load cassette 12. Wafer shuttle 13 moves semiconductor wafer 14 to wafer carrier 16. Robotic arm 20 carries semiconductor wafer 14 on wafer carrier 16. Pad 19 attaches to primary platen 18. When in contact with polishing pad 19, semiconductor wafer 14 is beneath robotic arm 20, held by the vacuum force of wafer carrier 16. As primary platen 18 rotates, slurry dispenser 22 dispenses slurry 23 on pad 19. As primary platen 18 rotates clockwise, it passes under end effector 24 which attaches to robotic arm 26. Although FIG. 2 shows end effector 24 retracted, when it conditions pad 19, end effector 24 moves back and forth over and in contact with pad 19 under the control of robotic arm 26.

Although numerous slurries may be used to polish semiconductors, slurry 23 is an aqueous dispersion of fumed silica which is made by the hydrolysis of very pure chlorosilanes in an oxygen/hydrogen flame at 1800° C. Marketed under the name SEMI-SPERSE® 25 and sold by Cabot Corporation of Toscola, Ill., the slurry has a nominal particle size of 30 nanometers and a weight percent solid of 25.0±0.3. Although the slurry that the present embodiment uses is highly pure, it still deposits impurities or particles on semiconductor wafer 14. In addition, the slurry has a pH in the present embodiment of approximately 10.8.

After the CMP process on semiconductor wafer 14, arm 20 transfers wafer carrier 16 and semiconductor wafer 14 to cleansing station 28. At cleansing station 28 spray mechanism 32 sprays a jet of water past $NH_4OH$ dispensing tube 36 for mixing water with a $NH_4OH$ mixture. This step removes the slurry from semiconductor wafer 14. Following the $NH_4OH$/water jet rinse, robotic arm 20 transfers carrier device 16 and semiconductor wafer 14 to a unload wafer track 15 that goes to unload cassette 38. Cassette elevator 17 submerses unload cassette 38 to make it available for further processing.

Figure 3:
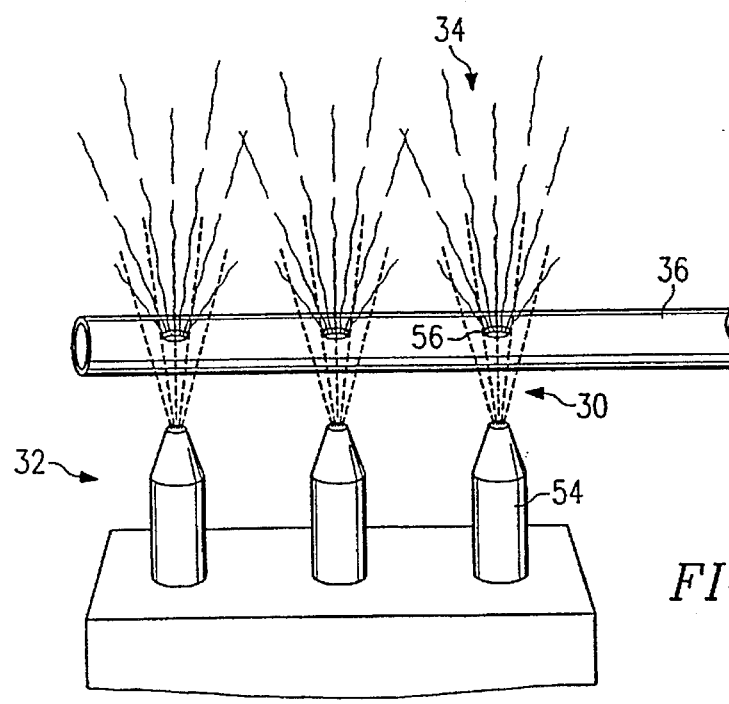
FIG. 3 provides a more detailed schematic drawing that illustrates association of the $NH_4OH$ dispenser with spray heads used in the CMP system of the present embodiment.

FIG. 3 shows in more detail the association of jets 54 that together form water dispensing mechanism 32. As FIG. 3 illustrates, jets 54 spray in the direction of $NH_4OH$ dispensing tube 36. $NH_4OH$ dispensing tube 36 includes numerous holes 56 through which $NH_4OH$ mist 34 may emit. Dispensing holes 56 form a small nozzle within $NH_4OH$ dispenser 36. By mixing spray 30 from jets 54 with $NH_4OH$ 34 from holes 56, an evenly mixed aqueous solution of $NH_4OH$ reaches semiconductor wafer 14.

The pressure of water emitting from jets 54, nominally 60–70 psia, has the desired effect of removing slurry from semiconductor wafer 14. The combination of $NH_4OH$ mist 34 within water jet spray 30 produces the further desired effect of neutralizing the basic pH of the slurry. This significantly benefits the removal of slurry from semiconductor wafer 14. The combined result is a significantly more complete removal of the slurry and a decrease the resulting particle count on semiconductor wafer 14 following the improved CMP process.

The pH controlling compound that the present embodiment uses is $NH_4OH$. The $NH_4OH$ concentration may vary according to the determined pH of the slurry. In addition, a surfactant or other cleansing compound that controls the pH may also be used instead of a $NH_4OH$ mixture. In applying high pressure jet spray 30 and $NH_4OH$ mixture 34, cleansing station platen 28 rotates at approximately 100 RPM. This is significantly faster than the conventional methods rotate. This increased rate of rotation assists to remove the undesired slurry.

An important technical advantage of the present embodiment is that it eliminates the buffing step that conventional CMP techniques employ. This presents the advantages of not only eliminating from the CMP process time the time which otherwise would be spent at a buffing station. It also eliminates the risk of damage to semiconductor wafer 14 that a buffing pad or buffing mechanism may pose. In addition, the combination of high pressure jet spray, together with the pH controlling compound, cleans and removes particles from semiconductor wafer 14 much more effectively than does the buffing step of conventional CMP processes. In fact, the process of the present embodiment has successfully achieved semiconductor wafers with fewer than 20 particles together with an increase in wafer polishing throughput by as much as 30%.

Figure 4:
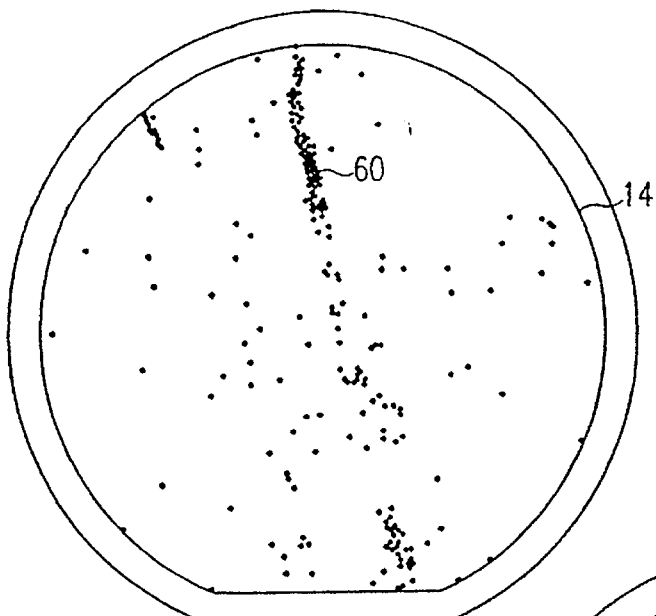
FIGS. 4 through 6 illustrate particle counts on semiconductor wafer, such that in FIGS. 4 and 5 appear results from conventional CMP processes to compare with the resulting particle count in FIG. 6 of the present embodiment CMP process.
Figure 5:
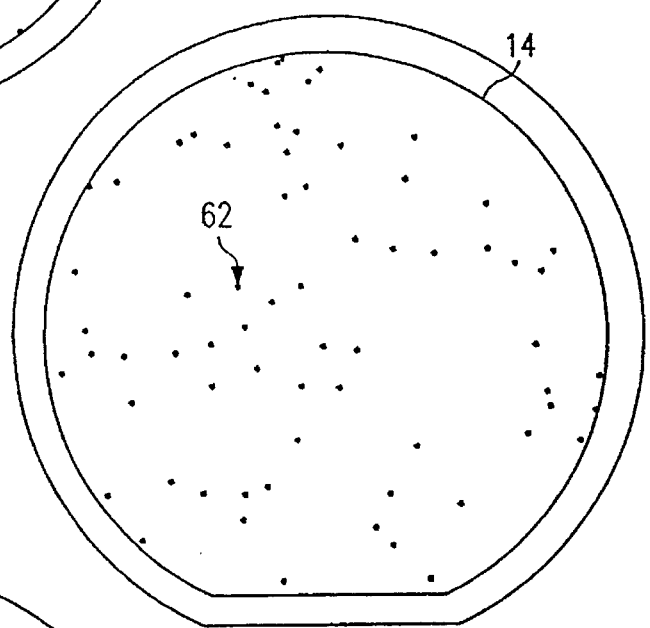
Figure 6:
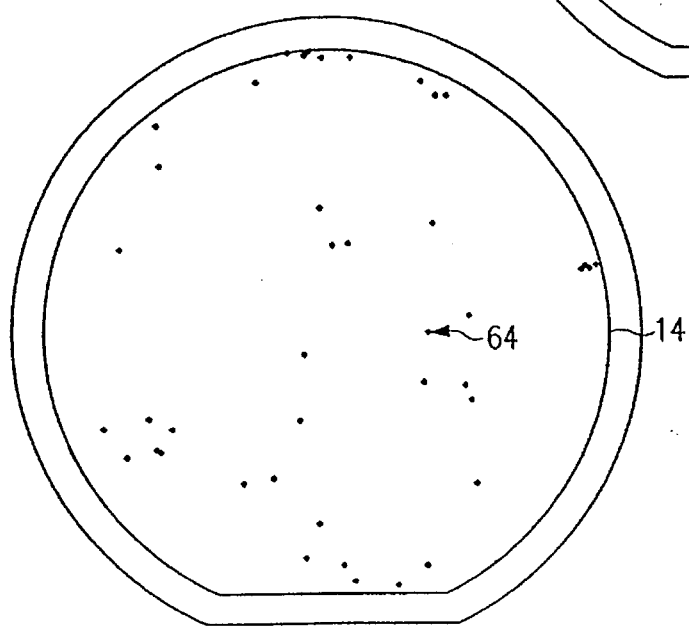

FIGS. 4 through 6 show varying amounts of particulate on semiconductor wafer 14. In particular, FIG. 4 shows the particulate 60 that appears on semiconductor wafer 14 as a result of a scratch from a buffing pad used in the conventional CMP process. Particulate 60 from the scratch amounts many hundreds of particles and virtually destroys the usefulness of the semiconductor wafer 14 in the scratch region. FIG. 5 shows the particulate 62 count that arises from the conventional CMP process that includes a buffing step that does not scratch semiconductor wafer 14. With the conventional process, the least particle 62 count is generally 60 to 80 particles per wafer. FIG. 6, on the other hand, shows the results of the present process as yielding a particle 64 count of less than 20 particles per wafer.

OPERATION

Although operation of the system of the present embodiment is clear from the above description, the following details operation of one embodiment that may be applied by modifying a device known as a Westech Avanti single wafer polishing system. An important modification to the Westech Avanti system would be, for example, removal from the process of its buffing station, together with the addition of pH controling dispenser 36. With these modifications, the following discussion details fully automated programmable process feedback control that the present invention would provide using a machine such as the Westech Avanti for planarizing an oxide, tungsten, or aluminum coating on a semiconductor wafer 14.

With reference to FIGS. 1 through 3, above, upon placing a load cassette 12 in wafer polishing system 10, wafer polishing system 10 transfers semiconductor wafer 14 to wafer carrier 16. Wafer carrier 16 holds semiconductor wafer 14 in place by vacuum force applied to the back side of semiconductor wafer 14. Robotic arm 20 lifts and places carrier 16 so that semiconductor wafer 14 contacts pad 19 on primary platen 18. Slurry applicator 22 applies a slurry 23 to pad 19. Then, the semiconductor wafer 14 is then polished as described above. After the CMP step is complete robotic mechanism 20 sends semiconductor wafer 14 to cleaning station 28 where pressure water spray 30 and pH controlling compound spray 34 removes as many particles as possible from semiconductor wafer 14. Then, robotic mechanism 20 removes semiconductor wafer 14 from cleaning station 28 and places semiconductor wafer directly into load cassette 38. This completes the chemical mechanical polishing process that present embodiment provides.

After chemical mechanical polishing of semiconductor wafer 14, further chemical buffing of semiconductor wafer 14 may occur. This may be done in an HF acid bath that smoothes the surface of semiconductor wafer 14. Because the HF acid bath is part of the conventional semiconductor wafer 14 fabrication process, no additional steps are necessary to perform the present process. As such, the above description of operation shows how the present embodiment successfully achieves the objectives of eliminating the time necessary in conventional processes of buffing semiconductor wafer 14 as well as the risk of wafer damage from buffing, and further removes a greater proportion of slurry 32 to reduce the particle count on semiconductor wafer 14.

ALTERNATIVE EMBODIMENTS

In summary, the present invention provides a method for chemical mechanical polishing a semiconductor wafer that includes the steps of coating the semiconductor wafer with a slurry having an predetermined pH value. Conditioning the semiconductor wafer with a conditioning disk takes place next. Then occurs the step of spraying the semiconductor wafer with an aqueous solution including a pH controlling compound for controlling the predetermined pH of said slurry and removing said slurry from the semiconductor wafer.

Although the invention has been described in detail herein with reference to the illustrative embodiments, it is to be understood that this description is by way of example only and is not to be construed in a limiting sense. For example, present invention may provide a polishing system wherein the slurry coating device is associated for simultaneously coating a plurality of the semiconductor wafers with a slurry having an predetermined pH value. The conditioning mechanism is associated for simultaneously conditioning the plurality of semiconductor wafers each with a conditioning disk. Furthermore, the system may include a spraying mechanism that simultaneously sprays the plurality of semiconductor wafers with the aqueous solution that has a pH controlling compound for controlling the predetermined pH of the slurry and removing the slurry from the semiconductor wafers.

It is to be further understood that numerous changes in the details of the embodiments of the invention and additional embodiments of the invention, will be apparent to, and may be made by, persons of ordinary skill in the art having reference to this description. It is contemplated that all such changes and additional embodiments are within the spirit and true scope of the invention as claimed below.

What is claimed is:

1. A method for chemical mechanical polishing a semiconductor wafer, comprising the steps of:

(a) coating the semiconductor wafer with a slurry having a pH value;

(b) polishing the slurry-coated semiconductor wafer with a polishing pad; and (c) spraying the semiconductor wafer with an aqueous solution including a pH controlling compound for controlling the pH of said slurry and removing said slurry from the semiconductor wafer, said step of spraying including spraying water to the semiconductor wafer through a mist of an $NH_4OH$ mixture.

2. The method of claim 1, further comprising the step of placing the semiconductor wafer in a cassette directly after spraying the semiconductor wafer, without further buffing the semiconductor wafer.

3. The method of claim 1, wherein said polishing step and said spraying step cooperate to reduce particle defects in the semiconductor wafer to fewer than 20 particles.

4. A method for polishing an electronic device, comprising the steps of:

(a) placing the electronic device in a polishing system, the polishing system comprising the primary platen having a polishing pad for polishing the electronic device nd a cleansing station for cleansing the electronic device;

(b) coating the electronic device with a slurry coating comprising a mixture of cleansing agents and abrasive materials;

(c) polishing the electronic device by contacting the electronic device having the slurry coating with the polishing pad;

(d) moving the electronic device to the cleansing station for removing the slurry coating from the electronic device;

(e) removing the slurry coating from the electronic device using a pressurized pH controlling mixture for controlling the pH of the slurry coating, said step of removing the slurry including the step of mixing an $NH_2OH$ compound with an atomized spray from a plurality of water jets directing water in the direction of the electronic device; and (f) removing the electronic device from the polishing system by placing the electronic device in a cassette without further buffing the electronic device.

5. The method of claim 4, wherein said electronic device is a semiconductor wafer.

6. The method of claim 4, further comprising the step of automatically placing said electronic device on said primary platen by robotically removing the electronic device from a first cassette formed to contain a plurality of the electronic devices and further wherein said coating step, said polishing step, and said slurring removing step are automatically controlled, and further robotically removing the electronic device from the polishing system to a second unload cassette.

7. A method for polishing an electronic device, comprising the steps of:

(a) placing the electronic device in a polishing system, the polishing system comprising the primary platen having a polishing pad for polishing the electronic device nd a cleansing station for cleansing the electronic device;

(b) coating the electronic device with a slurry coating comprising a mixture of cleansing agents and abrasive materials;

(c) polishing the electronic device by contacting the electronic device having the slurry coating with the polishing pad;

(d) moving the electronic device to the cleansing station for removing the slurry coating from the electronic device;

(e) removing the slurry coating from the electronic device using a pressurized pH controlling mixture for controlling the pH of the slurry coating, said step of removing the slurry including the step of mixing a surfactant compound with atomized spray that emits from a plurality of jets directing pressurized solvent to the electronic device; and (f) removing the electronic device from the polishing system by placing the electronic device in a cassette without further buffing the electronic device.

8. A method for chemical mechanical polishing a semiconductor wafer, comprising the steps of:

coating the semiconductor wafer with a slurry having a pH value;

polishing the slurry-coated semiconductor wafer with a polishing pad; and spraying the semiconductor wafer with an aqueous solution including a pH controlling compound for controlling the pH of said slurry and removing said slurry from the semiconductor wafer, said step of spraying including emitting a spray having a pressure of at least about 60 psia from a plurality of jets to the semiconductor wafer.

9. The method of claim 8, further including the step of rotating the semiconductor wafer at about 100 RPM during the step of spraying the semiconductor.

10. The method of claim 8, in which the step of spraying includes spraying water to the semiconductor wafer through a mist of an $NH_4OH$ mixture.

11. The method of claim 8, in which the step of spraying includes mixing a surfactant compound with atomized spray that emits from a plurality of jets directing pressurized solvent to the semiconductor wafer.

12. A method for chemical mechanical polishing a semiconductor wafer, comprising the steps of:

coating the semiconductor wafer with a slurry having a pH value;

polishing the slurry-coated semiconductor wafer with a polishing pad; and spraying the semiconductor wafer with an aqueous solution including a pH controlling compound for controlling the pH of said slurry and removing said slurry from the semiconductor wafer, said step of spraying including mixing a surfactant compound with atomized spray that emits from a plurality of jets directing pressurized solvent to the semiconductor wafer.

\* \* \* \* \*